United States Patent [19]

Shiihara

[11] Patent Number: 5,677,102
[45] Date of Patent: Oct. 14, 1997

[54] METHOD FOR THE PREPARATION OF PHOTORESIST SOLUTION

[75] Inventor: Kouji Shiihara, Kanagawa-ken, Japan

[73] Assignee: Tokyo Ohka Kogyo Co., Ltd., Japan

[21] Appl. No.: 618,608

[22] Filed: Mar. 20, 1996

[30] Foreign Application Priority Data

Mar. 28, 1995 [JP] Japan ................................. 7-069945

[51] Int. Cl.$^6$ ....................................... G03F 7/021
[52] U.S. Cl. ........................... 430/168; 430/192; 430/193
[58] Field of Search ............................... 430/168, 192, 430/193

[56] References Cited

U.S. PATENT DOCUMENTS

| | | | |
|---|---|---|---|
| 5,059,507 | 10/1991 | Uetani et al. | 430/192 |
| 5,290,658 | 3/1994 | Uenishi et al. | 430/192 |
| 5,429,904 | 7/1995 | Nagase et al. | 430/192 |
| 5,436,107 | 7/1995 | Tomioka et al. | 430/192 |

FOREIGN PATENT DOCUMENTS 6-256565  9/1994  Japan.

*Primary Examiner*—John S. Chu
*Attorney, Agent, or Firm*—Wenderoth, Lind & Ponack

[57] ABSTRACT

Proposed is a method for the preparation of a photoresist composition in the form of a solution which is free from the troubles due to formation of particles in the solution after prolonged storage. The method comprises the steps of (a) preparing a solution by dissolving an alkali-soluble resin and a quinone diazide group-containing compound in an organic solvent; and (b) subjecting the solution to a heat treatment at 75° to 85° C. for such a length of time that the solution diluted with ethyleneglycol monomethyl ether in a solid concentration of 0.2% has an absorbance of light in the range from 0.05 to 0.75 at a wavelength of 500 nm for an optical path length of 1 cm.

7 Claims, No Drawings

METHOD FOR THE PREPARATION OF PHOTORESIST SOLUTION

BACKGROUND OF THE INVENTION

The present invention relates to a method for the preparation of a photoresist composition or, more particularly, to an efficient method for the preparation of a photoresist composition in the form of a solution having greatly improved storage stability without the troubles due to formation of particulate materials therein even after storage for a long period of time.

As is known, the manufacturing process of electronic parts such as semiconductor devices, liquid crystal display panels and the like involves a photolithographic patterning process for the formation of a finely patterned resist layer on the surface of a substrate such as a semiconductor single crystal silicon wafer, glass plate and the like, in which the substrate surface is coated with a photoresist composition in the form of a solution followed by drying to form a uniform resist layer and the resist layer is exposed pattern-wise to actinic rays such as ultraviolet light to form a latent image of the pattern followed by a development treatment of the latent image to give a patterned resist layer.

Various types of photoresist compositions are used heretofore for the photolithographic patterning processes in the electronic industry. The photoresist compositions can be classified into two types including negative-working photoresist compositions, of which the film-forming resinous ingredient in the composition is cured in the areas irradiated pattern-wise with actinic rays to give a patterned resist layer by the development treatment to selectively dissolve away the resist layer in the unexposed areas, and positive-working photoresist compositions, of which the film-forming resinous ingredient is imparted by the pattern-wise exposure to actinic rays with increased solubility to a developer solution so as to be selectively dissolved away by the development treatment. Along with the trend in recent years toward higher and higher fineness of the patterning works in the electronic devices, the photoresist compositions are also required to be capable of giving a patterned resist layer of an increased fineness and, in this regard, positive-working photoresist compositions having excellent pattern resolution are preferred to the negative-working ones and, in particular, positive-working photoresist compositions in the form of a solution, which is prepared by dissolving an alkali-soluble resin and a quinone diazide group-containing compound in an organic solvent, are widely used.

Needless to say, it is very important in the use of a photoresist composition in the form of a solution containing an alkali-soluble resin and a quinone diazide group-containing compound dissolved in an organic solvent that the solution has excellent stability in storage in order to improve the yield of acceptable products in the manufacture of electronic devices. This requirement, however, cannot always be satisfied with conventional photoresist compositions in the form of a solution containing an alkali-soluble resin and a quinone diazide group-containing compound because the storage stability of these solutions is not high enough and, when such a photoresist solution is stored for a long period of time, troubles are sometimes caused by the formation of a large amount of fine particulate materials such as precipitation of crystals of the quinone diazide group-containing compound and the like in the solution.

In view of the above mentioned problems in the conventional photoresist solutions, various proposals and attempts have been made heretofore. For example, Japanese Patent Kokai 6-256565 proposes a method according to which the storage stability of a photoresist solution can be improved when the solution is prepared by mixing an actinic ray-sensitive compound, an alkali-soluble resin and an organic solvent at a temperature in the range from about 50° C. to about 70° C. Though effective to some extent for the improvement of the storage stability of a photoresist solution, however, this method is not quite satisfactory from the practical standpoint because the above mentioned troubles cannot be dissolved due to formation of particulate materials therein when the photoresist solution is stored for more than one month and the amount of particulate formation depends on the temperature at which the solution is stored. The trouble due to formation of fine particles in a photoresist solution is particularly serious when the quinone diazide group-containing compound as the photosensitizing agent as one of the essential ingredients of the photoresist solution is an esterification product of a quinone diazide group-containing compound such as 1,2-naphthoquinone diazide sulfonic acid and 1,2-benzoquinone diazide sulfonic acid with a polyhydroxy benzophenone compound such as 2,3,4-trihydroxy benzophenone and 2,3,4,4'-tetrahydroxy benzophenone of which the average degree of esterification is high to be at least 70%.

SUMMARY OF THE INVENTION

The present invention accordingly has an object to provide a novel and efficient method for the preparation of a photoresist composition in the form of a solution, in which formation of fine particles can be greatly reduced even after storage for a long period of time with little dependence of the amount of particle formation on the storage temperature and even by the use of a quinone diazide group-containing ester compound of a high degree of esterification to be suitable for the practical application.

Thus, the method of the present invention for the preparation of a photoresist solution having the above mentioned improved properties comprises the steps of:

(a) dissolving an alkali-soluble resin and a quinone diazide group-containing compound in an organic solvent at a temperature to form a solution; and (b) heating the solution at a temperature in the range from 75° C. to 85° C. to cause coloration of the solution with absorptivity of light at a wavelength of 500 nm until the absorbance at the wavelength of 500 nm reaches a value in the range from 0.05 to 0.75 or, in particular, in the range from 0.10 to 0.50 for a solution having a solid concentration of 0.2% by weight in ethyleneglycol monomethyl ether for an optical path length of 1 cm.

DETAILED DESCRIPTION OF THE PREFERRED EMBODIMENTS

As is described above, the most characteristic feature of the inventive method consists in the heat treatment of a solution prepared by dissolving an alkali-soluble resin and a quinone diazide group-containing compound in an organic solvent at a specified temperature to such a specified extent defined in terms of the absorbance of the solution to a light having a wavelength of 500 nm. The absorbance here implied is obtained by the measurement of light absorption for a solution of the photoresist composition with a solid concentration of 0.2% by weight as diluted with ethyleneglycol monomethyl ether for an optical path length of 1 cm in a fuzed quartz glass cell.

The alkali-soluble resin as a film-forming agent in the inventive photoresist solution is exemplified by alkali-soluble novolac resins, acrylic resins, copolymers of styrene and acrylic acid, polymers of hydroxystyrene, poly(vinyl phenol), poly(α-methyl vinylphenol) and the like, of which alkali-soluble novolac resins are preferred. The alkali-soluble novolac resin can be any of conventional novolac resins used in positive-working photoresist solutions as a film-forming agent including the condensation products obtained by the condensation reaction between an aromatic hydroxy compound such as phenol, cresol, xylenol and the like and an aldehyde compound such as formaldehyde and the like in the presence of an acidic catalyst, though not particularly limitative thereto. The alkali-soluble novolac resin should have a weight-average molecular weight in the range from 2000 to 20000 or, preferably, from 5000 to 15000 after removal of low molecular weight fractions by a fractionating treatment of the resin as prepared. The above named alkali-soluble resins can be used in combination of two kinds or more according to need.

The other essential ingredient to be dissolved in an organic solvent to form the inventive photoresist solution is a quinone diazide group-containing compound including full or partial esterification or amidation products obtained by the reaction between a quinone diazide sulfonic acid such as o-benzoquinone diazide sulfonic acid, o-naphthoquinone diazide sulfonic acid and o-anthraquinone diazide sulfonic acid or functional derivatives thereof, e.g., sulfonyl chloride, and a compound having a phenolic hydroxy group or amino group.

Examples of the above mentioned compound having a phenolic hydroxy group or amino group include: polyhydroxy benzophenone compounds such as 2,3,4-trihydroxy benzophenone, 2,2',4,4'-tetrahydroxy benzophenone and 2,3,4,4'-tetrahydroxy benzophenone; 1-[1-(4-hydroxyphenyl)isopropyl]-4-[1,1-bis(4-hydroxyphenyl) ethyl]benzene; tris(hydroxyphenyl)methane compounds and methyl-substituted derivatives thereof such as tris(4-hydroxyphenyl)methane, bis(4-hydroxy-3,5-dimethyl phenyl)-4-hydroxyphenyl methane, bis(4-hydroxy-2,5-dimethyl phenyl)-4-hydroxyphenyl methane, bis(4-hydroxy-3,5-dimethyl phenyl)-2-hydroxyphenyl methane, bis(4-hydroxy-2,5-dimethyl phenyl)-2-hydroxyphenyl methane, bis(4-hydroxy-2,3,5-trimethyl phenyl)-2-hydroxyphenyl methane and bis(4-hydroxy-2,3,5-trimethyl phenyl)-3,4-dihydroxyphenyl methane; and bis (cyclohexylhydroxyphenyl)hydroxyphenyl methane compounds and methyl-substituted derivatives thereof such as bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane, bis(3-cyclohexyl-2-hydroxyphenyl)-3-hydroxyphenyl methane, bis(3-cyclohexyl-2-hydroxyphenyl)-4-hydroxyphenyl methane, bis(3-cyclohexyl-2-hydroxyphenyl)-2-hydroxyphenyl methane, bis(5-cyclohexyl-2-hydroxy-4-methylphenyl)-2-hydroxyphenyl methane and bis(5-cyclohexyl-2-hydroxy-4-methylphenyl)-4-hydroxyphenyl methane; as well as other aromatic compounds having phenolic hydroxy groups or amino groups such as phenol, phenolic resins, p-methoxy phenol, dimethyl phenols, hydroquinone, bisphenol A, polyhydroxy diphenyl alkanes, polyhydroxy diphenyl alkenes, α,α',α"-tris(4-hydroxyphenyl)-1,3,5-triisopropyl benzene, naphthol, pyrocatechol, pyrogallol, pyrogallol monomethyl ether, pyrogallol-1,3-dimethyl ether, gallic acid, partial esterification or etherification products of gallic acid, aniline, P-aminodiphenylamine and the like.

Particularly preferable quinone diazide group-containing compounds include full or partial esterification products of a polyhydroxy benzophenone and naphthoquinone-1,2-diazide-5- or -4-sulfonic acid. More preferably, the esterification product mentioned above should have a degree of esterification of at least 70%.

These quinone diazide group-containing compounds can be used either singly or as a combination of two kinds or more according to need. The amount of the quinone diazide group-containing compound in the inventive photoresist solution is in the range from 1 to 100 parts by weight or, preferably, from 10 to 50 parts by weight per 100 parts by weight of the alkali-soluble resin.

The organic solvent in which the above described essential ingredients are dissolved can be any of those organic solvents conventionally used in the preparation of positive-working photoresist solutions including ester compounds such as methyl lactate, ethyl lactate, methyl acetate, ethyl acetate, butyl acetate, methyl pyruvate, ethyl pyruvate, methyl methoxy propionate and ethyl ethoxy propionate; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol, dipropyleneglycol monoacetate and monomethyl ether, monoethyl ether, monopropyl ether, monobutyl ether and monophenyl ether thereof, ketone compounds such as acetone, methyl ethyl ketone, cyclohexanone, methyl amyl ketone and methyl isoamyl ketone, cyclic ether compounds such as dioxane, and so on. These organic solvents can be used either singly or as a mixture of two kinds or more according to need.

In the preparation of a photoresist solution according to the inventive method, the above described alkali-soluble resin and the quinone diazide group-containing compound are dissolved in the organic solvent to form a solution which is subjected to a heat treatment at a temperature in the range from 75° to 85° C. The order of mixing of the respective constituents and the mixing means are not particularly limitative. For example, an alkali-soluble resin, a quinone diazide group-containing compound and an organic solvent are mixed together to give a uniform mixture and the mixture is heated at a temperature of 75° to 85° C. under agitation. Alternatively, the alkali-soluble resin alone is first dissolved in the organic solvent to form a resin solution to which the quinone diazide group-containing compound is added and dissolved therein followed by heating of the solution at 75° to 85° C. Further, a solution of the alkali-soluble resin in an organic solvent is heated at 75° to 85° C. and the quinone diazide group-containing compound is added to the hot solution followed by continued heating at the same temperature. This last method is preferable because a photoresist solution having high stability can be easily obtained thereby. The heating temperature must be in the above mentioned range since no good storage stability can be imparted to the photoresist solution prepared by heating at a temperature outside of this range. The solid content in the thus prepared solution to be subjected to the heat treatment in step (b) is preferably in the range from 20% to 60% by weight.

The length of time for the above mentioned heat treatment of the solution of an alkali-soluble resin and a quinone diazide group-containing compound in a solvent at 75° to 85° C. must be so long that, while the solution becomes colored by continuing the heat treatment, the absorbance of the photoresist solution as diluted with ethyleneglycol monomethyl ether in a solid concentration of 0.2% by weight is in the range from 0.05 to 0.75 or, preferably, from 0.10 to 0.50 at a wavelength of 500 nm for an optical path length of 1 cm. When the length of time for the heat treatment is too short and the absorbance of the solution is lower than the above mentioned lower limit, the desired improvement relative to formation of fine particles in the solution cannot be obtained as a matter of course while, when the length of time for the heat treatment is too long and the absorbance of the solution exceeds the above mentioned upper limit, formation of fine particles is resulted in the solution and the characteristics of the photoresist solution are adversely affected.

The actual length of time for the heat treatment to meet the above described requirement for the absorbance of the diluted solution, though naturally depending on the temperature of the heat treatment, is usually in the range from 30 minutes to 10 hours or, in most cases, from 1 to 7 hours. When the heat treatment is performed too short or too long, the absorbance of the photoresist solution would be too low or too high to cause the above described disadvantages.

In the following, the method of the present invention is described in more detail by way of examples although the scope of the invention is never limited thereby. In the following examples, the term of "parts" always refers to "parts by weight".

EXAMPLE 1

Into a three-necked flask were introduced 1200 parts of a cresol novolac resin prepared by the condensation reaction of a 4:6 mixture of m-cresol and p-cresol with formaldehyde and having a weight-average molecular weight of 8000 as determined by making reference to polystyrenes and 2900 parts of ethyleneglycol monomethyl ether acetate and the blend was gradually heated under agitation at such a rate that the temperature reached 75° C. after about 40 minutes so that the resin was dissolved in the solvent to form a uniform solution.

The solution kept at 75° C. was admixed with 350 parts of a quinone diazide group-containing compound which was an esterification product obtained by the condensation reaction conducted in a conventional manner between 1 mole of 2,3,4,4'-tetrahydroxy benzophenone and 2.3 moles of 1,2-naphthoquinone diazide-5-sulfonyl chloride to give an average degree of esterification of 75% followed by continued agitation of the solution for about 200 minutes so as to dissolve the added compound in the solution. A part of the solvent was removed from the solution under reduced pressure taking about 30 minutes followed by cooling of the solution down to room temperature to give a photoresist solution, of which the solid content was 40% by weight.

A small portion of this solution was taken and diluted with ethyleneglycol monomethyl ether to have a solid content of 0.2% by weight and the absorbance of the thus diluted solution was measured in a fused quartz glass cell of 1 cm optical path length on a spectrophotometer (Model 330, manufactured by Hitachi Ltd.) to give a value of 0.15 at a wavelength of 500 nm.

The photoresist solution was diluted with ethyleneglycol monomethyl ether acetate under agitation for 30 minutes to have a solid content of 30% by weight followed by filtration through a Teflon filter having a pore diameter of 0.1 μm. The thus prepared solution was divided into four equal portions in four hermetically sealable vessels which were kept for 3 months at 5° C., 18° C., 23° C. and 30° C. respectively, followed by counting of the particles having a particle diameter of 25 μm or larger per 1 ml in each portion of the solution with a particle counter (Model KL-20, manufactured by Lyon Co.) to give the results shown in Table 2, which also gives the increment in the number of particles over the value before storage.

EXAMPLES 2 TO 12 AND COMPARATIVE EXAMPLES 1 TO 11

The procedure for the preparation of a photoresist solution and the testing procedure thereof in each of these Examples and Comparative Examples were substantially the same as in Example 1 except that the conditions of the heat treatment of the solution including the temperature and length of time for the heat treatment, which were 75° c. and 200 minutes in Example 1, were as shown in Table 1 below which also shows the absorbance of a diluted solution of the photoresist solution in a solid concentration of 0.2% by weight at a wavelength of 500 nm. Table 2 shows the number of particles in each of the photoresist solutions as prepared and after storage for 3 months at varied temperatures.

TABLE 1

|  |  | Heat treatment | | |
|---|---|---|---|---|
|  |  | Temperature, °C. | Length of time, minutes | Absorbance |
| Example | 1 | 75 | 200 | 0.15 |
|  | 2 | 75 | 60 | 0.08 |
|  | 3 | 75 | 100 | 0.12 |
|  | 4 | 75 | 300 | 0.33 |
|  | 5 | 75 | 400 | 0.43 |
|  | 6 | 85 | 40 | 0.09 |
|  | 7 | 85 | 60 | 0.26 |
|  | 8 | 85 | 100 | 0.42 |
|  | 9 | 85 | 140 | 0.58 |
|  | 10 | 85 | 180 | 0.75 |
|  | 11 | 80 | 100 | 0.19 |
|  | 12 | 80 | 300 | 0.45 |
| Comparative example | 1 | 65 | 100 | 0.05 |
|  | 2 | 65 | 200 | 0.09 |
|  | 3 | 65 | 300 | 0.12 |
|  | 4 | 65 | 400 | 0.15 |
|  | 5 | 65 | 500 | 0.18 |
|  | 6 | 90 | 30 | 0.22 |
|  | 7 | 90 | 120 | 0.88 |
|  | 8 | 70 | 80 | 0.06 |
|  | 9 | 70 | 400 | 0.26 |
|  | 10 | 80 | 30 | 0.04 |
|  | 11 | 80 | 450 | 0.82 |

TABLE 2

|  |  | Number of particles/ml | | | | | |
|---|---|---|---|---|---|---|---|
|  |  | as prepared | 5° C. | 18° C. | 23° C. | 30° C. | difference* |
| Example | 1 | 14 | 50 | 38 | 32 | 40 | 18 |
|  | 2 | 21 | 55 | 52 | 46 | 35 | 20 |
|  | 3 | 16 | 36 | 41 | 30 | 33 | 11 |
|  | 4 | 22 | 39 | 37 | 36 | 30 | 9 |
|  | 5 | 19 | 38 | 41 | 40 | 38 | 3 |
|  | 6 | 18 | 70 | 66 | 58 | 50 | 20 |
|  | 7 | 22 | 29 | 30 | 37 | 41 | 12 |
|  | 8 | 14 | 38 | 42 | 37 | 40 | 5 |
|  | 9 | 26 | 47 | 55 | 35 | 38 | 20 |
|  | 10 | 11 | 54 | 55 | 61 | 63 | 9 |
|  | 11 | 19 | 31 | 38 | 31 | 29 | 9 |
|  | 12 | 26 | 40 | 33 | 35 | 32 | 8 |
| Comparative example | 1 | 19 | 852 | 701 | 714 | 685 | 167 |
|  | 2 | 20 | 441 | 346 | 355 | 141 | 300 |
|  | 3 | 18 | 387 | 335 | 275 | 99 | 288 |
|  | 4 | 15 | 199 | 154 | 97 | 98 | 102 |

TABLE 2-continued

|   | Number of particles/ml | | | | | |
|---|---|---|---|---|---|---|
|   | as pre-pared | 5° C. | 18° C. | 23° C. | 30° C. | diff-erence* |
| 5  | 25 | 155 | 177 | 185 | 197 | 42 |
| 6  | 24 | 144 | 198 | 163 | 131 | 67 |
| 7  | 20 | 437 | 471 | 488 | 576 | 139 |
| 8  | 17 | 314 | 298 | 335 | 248 | 87 |
| 9  | 25 | 122 | 124 | 88  | 85  | 39 |
| 10 | 26 | 160 | 112 | 61  | 44  | 116 |
| 11 | 21 | 88  | 93  | 101 | 121 | 33 |

*difference between the largest and smallest numbers at varied temperatures

What is claimed is:

1. A method for the preparation of a photoresist solution which comprises the steps of:

(a) dissolving an alkali-soluble resin and a quinone diazide group-containing compound in an organic solvent to form a solution; and (b) subjecting the solution to a heat treatment at a temperature in the range from 75° C. to 85° C. to cause coloration of the solution for such a length of time that the solution diluted with ethyleneglycol monomethyl ether to have a solid concentration of 0.2% by weight has an absorbance of light in the range from 0.05 to 0.75 at a wavelength of 500 nm for an optical path length of 1 cm.

2. The method for the preparation of a photoresist solution as claimed in claim 1 in which the absorbance of the solution diluted with ethyleneglycol monomethyl ether to have a solid concentration of 0.2% by weight at a wavelength of 500 nm is in the range from 0.10 to 0.50 for an optical path length of 1 cm.

3. The method for the preparation of a photoresist solution as claimed in claim 1 in which the alkali-soluble resin is an alkali-soluble novolac resin having a weight-average molecular weight in the range from 2000 to 20000.

4. The method for the preparation of a photoresist solution as claimed in claim 1 in which the quinone diazide group-containing compound is an esterification product of a polyhydroxy benzophenone compound and naphthoquinone-1,2-diazide-5- or naphthoquinone-1,2-diazide-4-sulfonic acid with a degree of esterification of at least 70%.

5. The method for the preparation of a photoresist solution as claimed in claim 1 in which the amount of the quinone diazide group-containing compound is in the range from 1 to 100 parts by weight per 100 parts by weight of the alkali-soluble resin.

6. The method for the preparation of a photoresist solution as claimed in claim 1 in which the solid concentration prepared in step (a) is in the range from 20 to 60% by weight.

7. The method for the preparation of a photoresist solution as claimed in claim 1 in which the solution prepared in step (a) is obtained by dissolving the quinone diazide group-containing compound in a solution of the alkali-soluble resin in the organic solvent kept at a temperature in the range from 75° C. to 85° C.

* * * * *